United States Patent
Aoki et al.

(10) Patent No.: US 6,452,472 B1
(45) Date of Patent: Sep. 17, 2002

(54) POLE-PIECE UNIT, METHOD FOR ASSEMBLING THE SAME, AND MAGNETIC FIELD GENERATOR

(75) Inventors: Masaaki Aoki, Takatsuki; Tsuyoshi Tsuzaki, Ibaraki, both of (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/712,906

(22) Filed: Nov. 16, 2000

(30) Foreign Application Priority Data

Nov. 16, 1999 (JP) .......................... 11-325560
Mar. 10, 2000 (JP) ...................... 2000-066865

(51) Int. Cl.⁷ ............................... H01F 7/00
(52) U.S. Cl. ...................... 335/296; 335/299
(58) Field of Search .............. 335/216, 296–299; 324/318–321

(56) References Cited

U.S. PATENT DOCUMENTS

| | | | | |
|---|---|---|---|---|
| 4,672,346 A | * | 6/1987 | Miyamoto et al. | 335/296 |
| 4,679,022 A | * | 7/1987 | Miyamoto et al. | 335/296 |
| 5,194,810 A | * | 3/1993 | Breneman et al. | 324/319 |

FOREIGN PATENT DOCUMENTS

| JP | 2-49683 | 12/1990 |
|---|---|---|
| JP | 3-20053 | 3/1991 |

* cited by examiner

*Primary Examiner*—Lincoln Donovan
(74) *Attorney, Agent, or Firm*—Armstrong, Westerman & Hattori, LLP.

(57) ABSTRACT

A magnetic field generator comprises a pair of pole-piece units. The pair of pole-piece units respectively include plate yokes. Each of the plate yokes includes a surface facing the other's and provided with a permanent magnet group and a pole piece. The pole piece includes an annular projection having a plurality of annular-projection pieces and a permanent magnet for reduction of magnetic flux leakage installed on an outside surface of each annular-projection piece. When assembling the pole piece, first, the permanent magnet for reduction of magnetic flux leakage is fixed on the outside surface of each annular-projection piece. At this time, the permanent magnet is slid on the flat outside surface of the annular-projection piece, to a desired position on the annular-projection piece, and then fixed. Each of the annular-projection pieces mounted with the permanent magnet is fixed on a base plate. At this time, the annular-projection piece is lowered on a guide stake attached on the base plate, allowing the stake into a guide hole formed in the annular-projection piece, thereby guiding the annular-projection piece onto the base plate. The pair of pole-piece units are magnetically connected by a column yoke. The permanent magnet for reduction of magnetic flux leakage may be disposed with a magnetizing direction thereof being slanted with respect to a main surface of the permanent magnet group.

6 Claims, 13 Drawing Sheets

FIG. 12

|  | Magnetic field strength (T) | Total weight of magnet (kg) | Distance d between pole pieces (mm) |
|---|---|---|---|
| When magnetizing angle $\theta$=0 degree | 0.415 | 2413 | 395 |
| When magnetizing angle $\theta$=30 degrees | 0.415 | 2313 | 395 |
| Without permanent magnets 118 | 0.415 | 2923 | 395 |

POLE-PIECE UNIT, METHOD FOR ASSEMBLING THE SAME, AND MAGNETIC FIELD GENERATOR

BACKGROUND OF THE INVENTION

1. Field of the Invention

The present invention relates to a pole-piece unit, a method for assembling the same, and a magnetic field generator. More specifically, the present invention relates to a pole-piece unit, a method for assembling the same, and a magnetic field generator used for an MRI apparatus and so on which requires an intense magnetic field greater than 0.3 T.

2. Description of the Related Art

In this kind of large magnetic field generator, e.g. a magnetic field generator for an MRI, in order to reduce magnetic flux leakage from pole pieces and to concentrate the magnetic flux effectively onto a space between the pole pieces, the applicant of the present invention proposed an arrangement, as disclosed in the Japanese Utility Model (of examined Application for opposition) No. 2-49683, in which a permanent magnet for repelling the magnetic flux leakage is provided on an outside surface of an annular projection. When an intense magnetic field is required in this related art, a R—Fe—B magnet which has an intense magnetic power is used as the permanent magnet. In this case, the permanent magnet to be bonded comes under an intense repelling force when brought near the permanent magnet which is already bonded. Thus, it is difficult to bond the permanent magnet to the annular projection which is formed as a single piece, resulting in a poor production efficiency.

Further, according to the above related art, the permanent magnet for repelling the magnetic flux leakage is a magnet magnetized in a direction in parallel to a main surface of a permanent magnet used for generation of the magnetic field. If a uniform space is to be enlarged, the amount of magnet must be increased, causing a problem of increased cost.

SUMMARY OF THE INVENTION

It is therefore a primary object of the present invention to provide a pole-piece unit, a method for assembling the same, and a magnetic field generator for improved production efficiency.

Another object of the present invention is to provide a magnetic field generator in which the uniform space can be increased without increasing the cost.

According to an aspect of the present invention, there is provided a pole-piece unit comprising: a plate yoke; a permanent magnet group provided on a main surface of the plate yoke; and a pole piece provided on a main surface of the permanent magnet group; wherein the pole piece includes an annular projection having a plurality of annular-projection pieces, and a permanent magnet for reduction of magnetic flux leakage provided on an outside surface of each of the annular-projection pieces.

According to another aspect of the present invention, there is provided a method for assembling a pole-piece unit, comprising: a first step of fixing a permanent magnet onto an outside surface of an annular-projection piece; and a second step of fixing the annular-projection piece already mounted with the permanent magnet onto a main surface of a base plate.

According to this invention, the permanent magnet is fixed in advance onto the outside surface of each annular-projection piece, and a predetermined number of the annular-projection pieces each mounted with the permanent magnet are installed onto the base plate. Therefore, there is no need for installing the permanent magnets to the annular projection which has been disposed on the base plate. Thus, fixation of the permanent magnets becomes easy, and assembling of the pole-piece unit becomes easy, making possible to improve productivity in manufacture of the pole-piece unit.

According to another aspect of the present invention, there is provided a magnetic field generator comprising a pair of the pole-piece units, and a column yoke magnetically connecting the pair of the pole-piece units.

According to this invention, by using the above pole-piece unit which can be assembled easily, the magnetic field generator is obtained easily, and productivity is increased.

Preferably, in the above method for assembling the pole-piece unit, the annular-projection piece has a guide hole; and the second step includes a step A of attaching a guide stake to the base plate, and a step B of guiding the annular-projection piece already mounted with the permanent magnet to the main surface of the base plate, by inserting the guide stake into the guide hole. In this case, the annular-projection piece can be guided to a desired place on the base plate, and therefore, positioning of the annular-projection piece becomes easy and the assembling of the pole-piece unit becomes easy.

According to still another aspect of the present invention, there is provided a method for assembling a pole-piece unit including an annular-projection piece having a flat outside surface, wherein a permanent magnet is slid on the outside surface for fixation of the permanent magnet to a desired position on the annular-projection piece.

According to this invention, since the outside surface of the annular-projection piece is a flat surface, the permanent magnet can be slid linearly and easily on the outside surface. Therefore, the permanent magnet can be easily transported and fixed to a desired position on the outside surface of the annular-projection piece. Thus, the assembling of the pole-piece unit becomes easy, and productivity in the manufacture of the pole-piece unit is improved.

According to still another aspect of the present invention, there is provided a magnetic field generator comprising: a plate yoke; a permanent magnet group provided on a main surface of the plate yoke; and a pole piece provided on a main surface of the permanent magnet group; wherein the pole piece includes an annular projection and a permanent magnet for reduction of magnetic flux leakage provided on an outside surface of the annular projection, and the permanent magnet for reduction of magnetic flux leakage is disposed, with a magnetizing direction thereof being slanted with respect to the main surface of the permanent magnet group.

According to this invention, by disposing the permanent magnet for reduction of magnetic flux leakage, with the magnetizing direction slanted with respect to the main surface of the permanent magnet group, greater amount of magnetic flux can be introduced into an imaging space, and the uniform space can be enlarged. Therefore, the uniform space of magnetic field strength can be enlarged without increasing the amount of permanent magnet to be used, and without increasing cost.

Preferably, the permanent magnet for reduction of magnetic flux leakage is generally rectangular parallelepiped, and the magnetizing direction makes an acute angle with respect to a main surface of the permanent magnet. In this case, by only disposing the permanent magnet for reduction of magnetic flux leakage directly onto the main surface of the permanent magnet group, disposition of the permanent magnet for reduction of magnetic flux leakage having a desired magnetizing angle can be carried out easily.

Further, preferably, the permanent magnet for reduction of magnetic flux leakage is generally rectangular parallelepiped, and is slanted with respect to the main surface of the permanent magnet group. In this case, a permanent magnet magnetized in any direction can be used as the permanent magnet for reduction of magnetic flux leakage.

Further, preferably, a dimension of the pole piece is determined in accordance with a magnetizing angle of the permanent magnet for reduction of magnetic flux leakage. By adjusting the size of the pole piece in accordance with a magnetizing angle of the permanent magnet for reduction of magnetic flux leakage, a center magnetic field strength can be increased without increasing the amount of permanent magnet to be used and without increasing cost. Especially, it is more preferable if the magnetizing angle of the permanent magnet for reduction of magnetic flux leakage is greater than 0 degree and smaller than 60 degrees.

It should be noted here that in this specification, the term "magnetizing angle" means an angle made by a main surface of the permanent magnet group and a direction in which the permanent magnet for reduction of magnetic flux leakage is magnetized. The term "uniform space" means a magnetic-field space in which the magnetic field uniformity is within 100 ppm. The term "center magnetic field strength" means a magnetic field strength at a center portion of the uniform space.

The above objects, other objects, characteristics, aspects and advantages of the present invention will become clearer from the following description of embodiments to be presented with reference to the accompanying drawings.

BRIEF DESCRIPTION OF THE DRAWINGS

FIG. 12 is a table showing an example of comparison in terms of a total weight of magnets when the center magnetic field strength and the distance between the pole pieces are kept constant.

DETAILED DESCRIPTION OF THE PREFERRED EMBODIMENTS

Now, embodiments of the present invention will be described with reference to the accompanying drawings.

Figure 1:
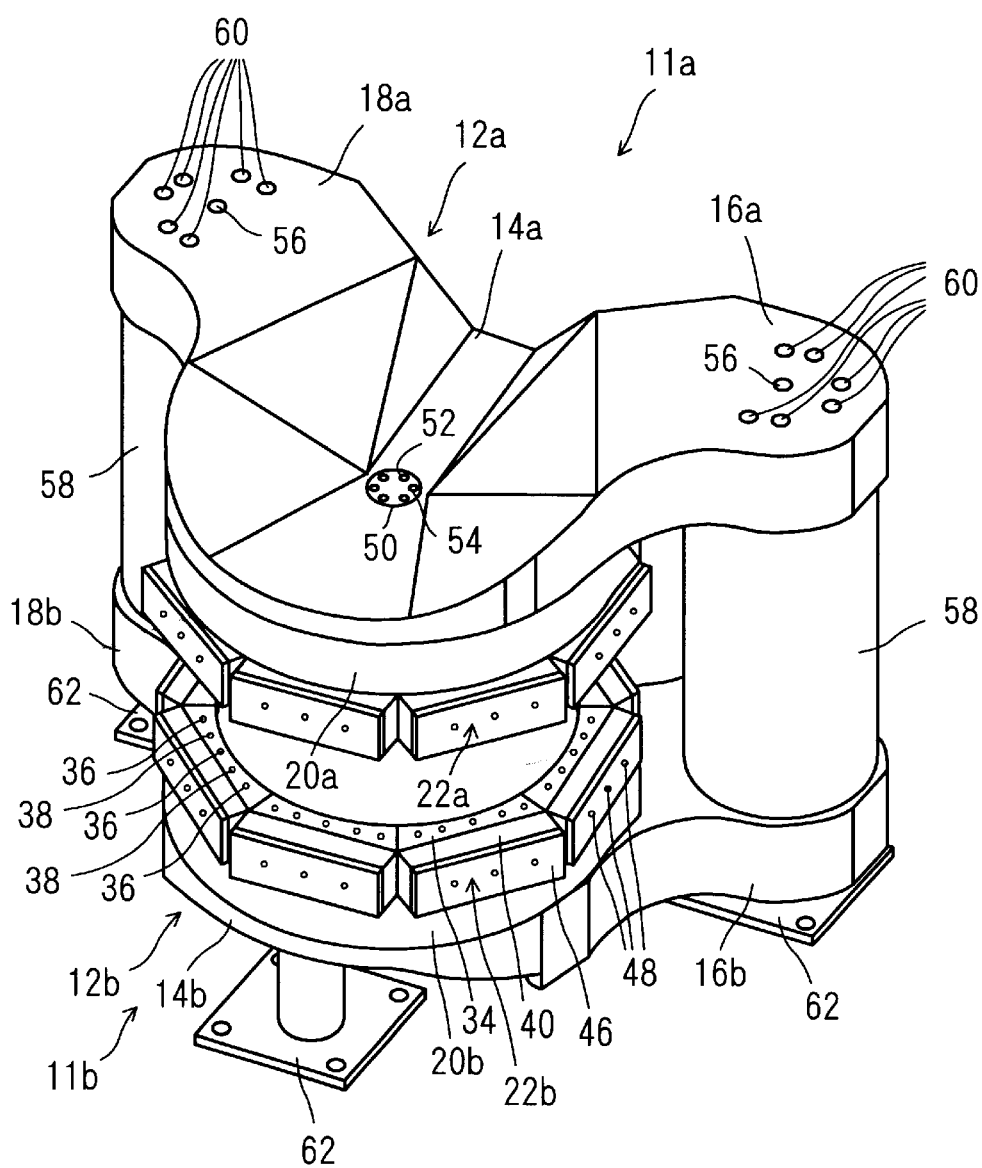
FIG. 1 is a perspective view showing an outline of an embodiment of the present invention.

Referring now to FIG. 1, a magnetic field generator 10 as a first embodiment of the present invention, to be used for an MRI, is an open type magnetic field generator comprising a pair of pole-piece units 11a, 11b facing each other with a space in between. The pole-piece units 11a, 11b respectively include plate yokes 12a, 12b. The plate yoke 12a includes a generally disc-shaped main body 14a and two connecting portions 16a, 18a extending from the main body 14a. Likewise, The plate yoke 12b includes a generally disc-shaped main body 14b and two connecting portions 16b, 18b extending from the main body 14b.

The main body 14a of the plate yoke 12a and the main body 14b of the plate yoke 12b have respective surfaces faced with each other and provided with permanent magnet groups 20a and 20b. The permanent magnet groups 20a, 20b have respective surfaces faced with each other and provided with pole pieces 22a and 22b respectively fastened thereto.

Figure 2:
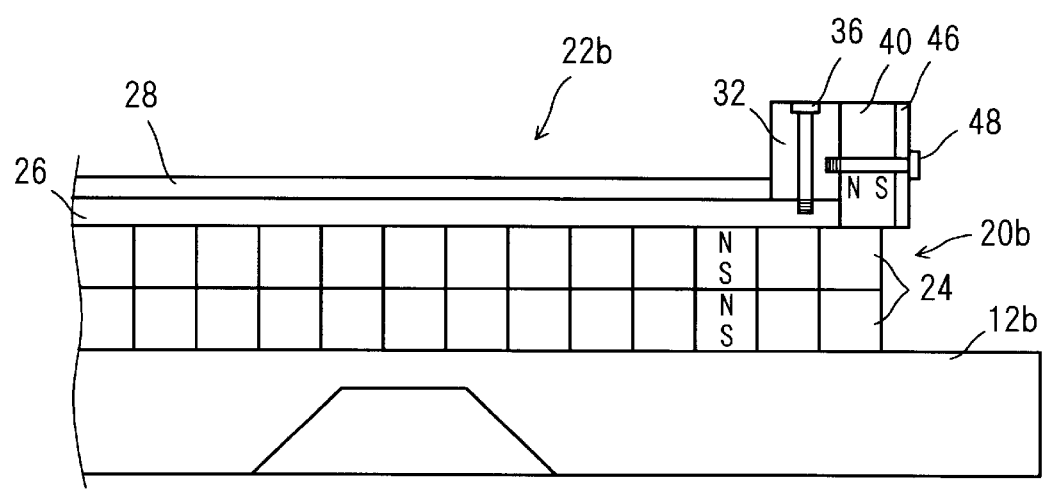
FIG. 2 is an illustration showing a primary portion of a pole-piece unit.

As shown in FIG. 2, the permanent magnet group 20b includes a plurality of generally rectangular parallelepiped unit-piece magnets 24 each made of a R—Fe—B magnet for example. The R—Fe—B magnet (wherein R represents rare-earth elements including yttrium Y) is disclosed in the U.S. Pat. Nos. 4,770,723 or 4,792,368. The same applies to the permanent magnet group 20a.

The pole piece 22b includes a base plate 26 made of disc-shaped iron for example, disposed on the permanent magnet group 20b. The base plate 26 has an upper surface provided with a silicon steel plate 28 for preventing generation of eddy current. The silicon steel plate 28 is fixed with an adhesive onto the base plate 26.

Figure 3:
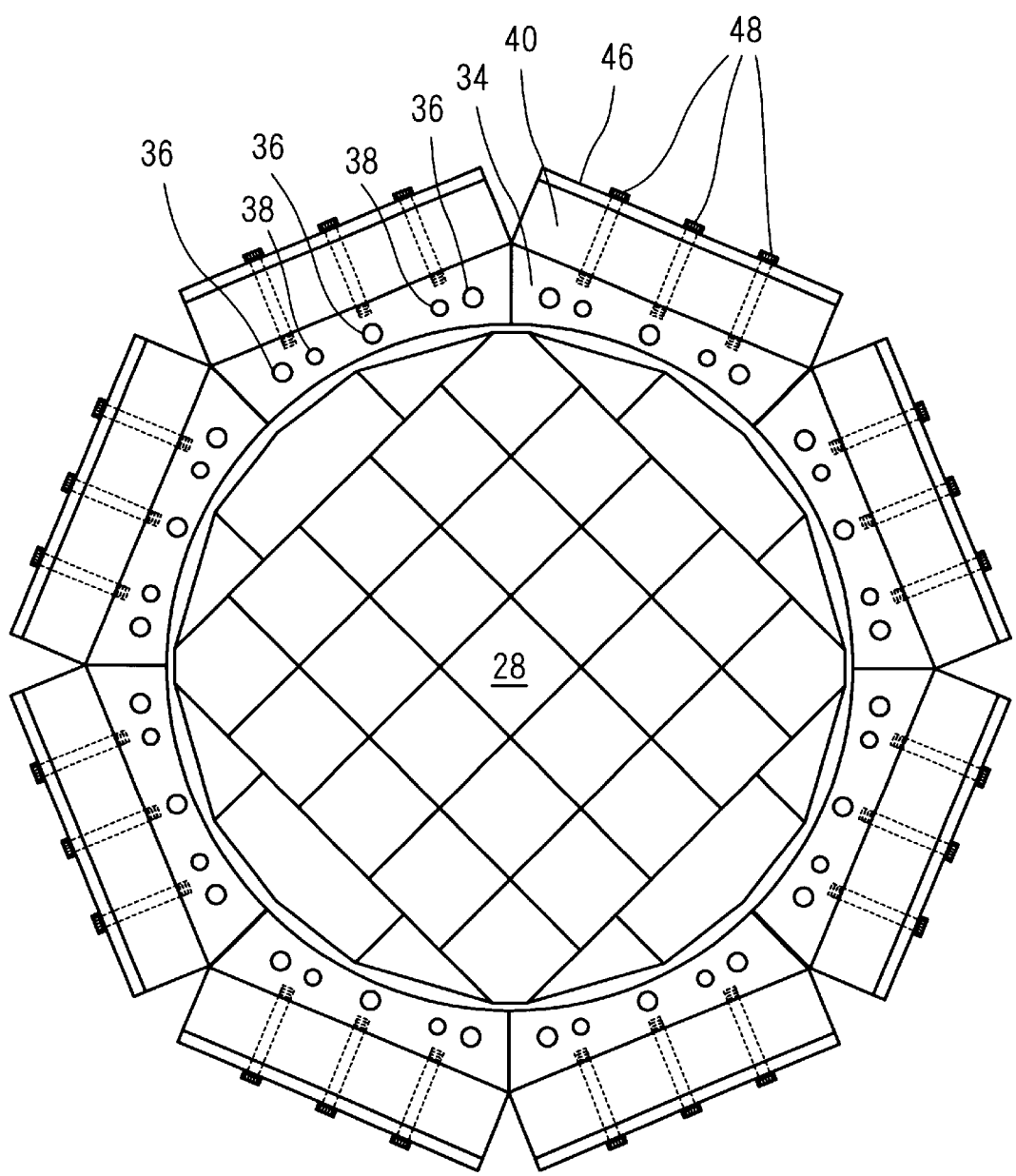
FIG. 3 is a plan view showing a pole piece.

The base plate 26 has a circumferential portion formed with an annular projection 32, made of iron for example, for increasing magnetic field strength around the circumferential portion. As shown in FIG. 3, the annular projection 32 includes a plurality (e.g. eight, according to the present embodiment) of annular-projection pieces 34. Each of the annular-projection pieces 34 has a concavely arced inside surface and a flat outside surface. The annular projection 32 is formed by bolting each of the annular-projection pieces 34 with screws 36 to the base plate 26 of a circumferential portion of the silicon steel plate 28. In other words, the annular projection 32 is made of the radially divided pieces. The annular projection 32, or more specifically each of the annular projection pieces 34, is formed with two guide holes 38 each as a vertical through hole for assembling. Each of the guide holes 38 has a threaded inner surface to be engaged by a screw 92 to be described later.

Figure 4:
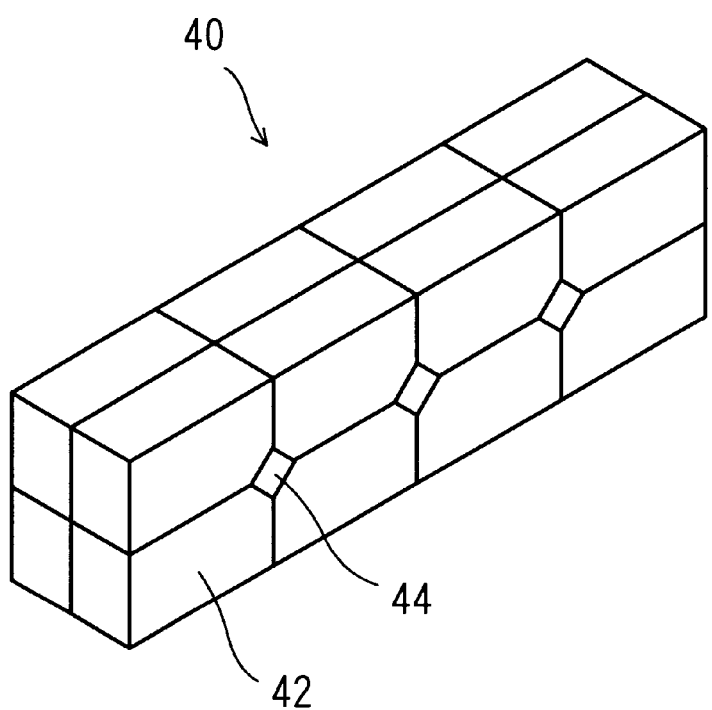
FIG. 4 is a perspective view showing a permanent magnet.

The outside surface of each annular-projection piece 34 is mounted with a permanent magnet 40 for reduction of magnetic flux leakage. The permanent magnet 40 induces magnetic flux to concentrate between the pole pieces 22a, 22b, making possible to reduce the magnetic flux leakage. As shown in FIG. 4, the permanent magnet 40 includes a plurality of generally rectangular parallelepiped unit-piece magnets 42 each made of a R—Fe—B magnet for example.

According to the present embodiment, a total of sixteen (=2×2×4) unit-piece magnets 42 are stacked into a generally rectangular parallelepiped permanent magnet 40. It should be noted here that through holes 44 are formed by cutting off a corner portion of each unit-piece magnet 42.

Figure 5A:
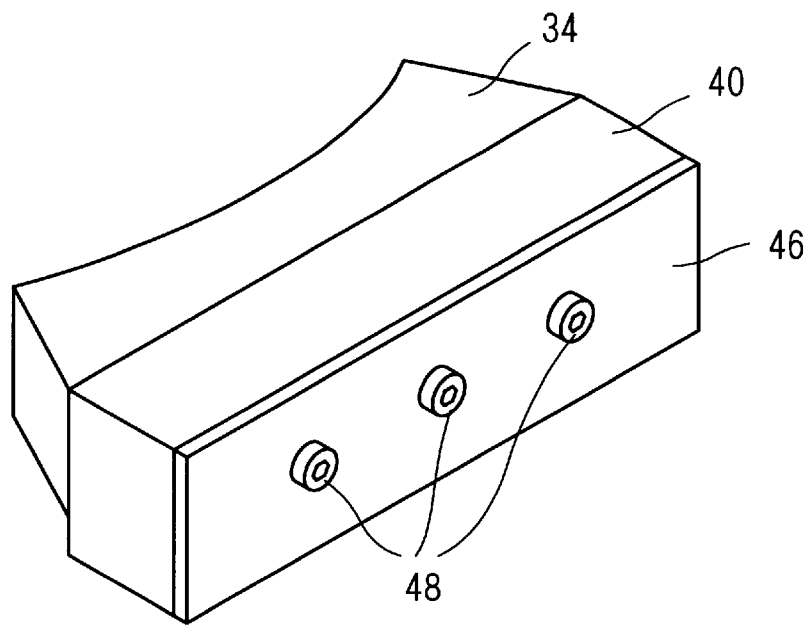
FIG. 5A is a perspective view showing an annular-projection piece mounted with the permanent magnet.
Figure 5B:
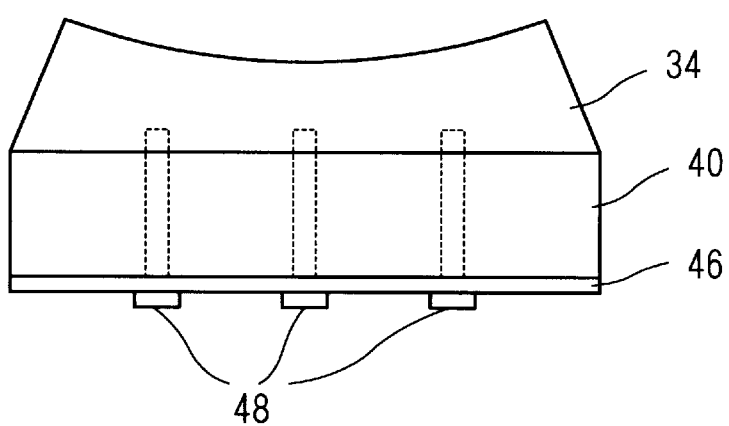
FIG. 5B is a plan view thereof.

As will be understood clearly from FIG. 5A and FIG. 5B, a rectangular retainer plate 46, made of a nonmagnetic material such as SUS304 and aluminum, is disposed on an outside surface of each permanent magnet 40 mounted to the outside surface of the annular-projection piece 34. The permanent magnet 40 and the retainer plate 46 are fixed to the annular-projection piece 34 by fixing screws 48 inserted through the through holes 44. Further, as will be understood from FIG. 2 and FIG. 5A, in order to reduce the magnetic flux leakage from a bottom portion of the permanent magnet 40, it is preferable that a lower portion of the permanent magnet 40 is extended to make the bottom of the permanent magnet 40 contact the permanent magnet group 20b. The same applies to the pole piece 22a.

Returning to FIG. 1, a movable yoke 50 for fine adjustment of the magnetic field is disposed at a center portion of the plate yoke 12a. The movable yoke 50 is provided with three bolts 52 for adjusting vertical position thereof, and three stoppers 54 for regulating the position thereof. The same arrangement applies to the plate yoke 12b. The connecting portions 16a, 18a of the plate yoke 12a are respectively provided with threaded holes 56 to which hoisting hooks are to be attached.

Figure 6:
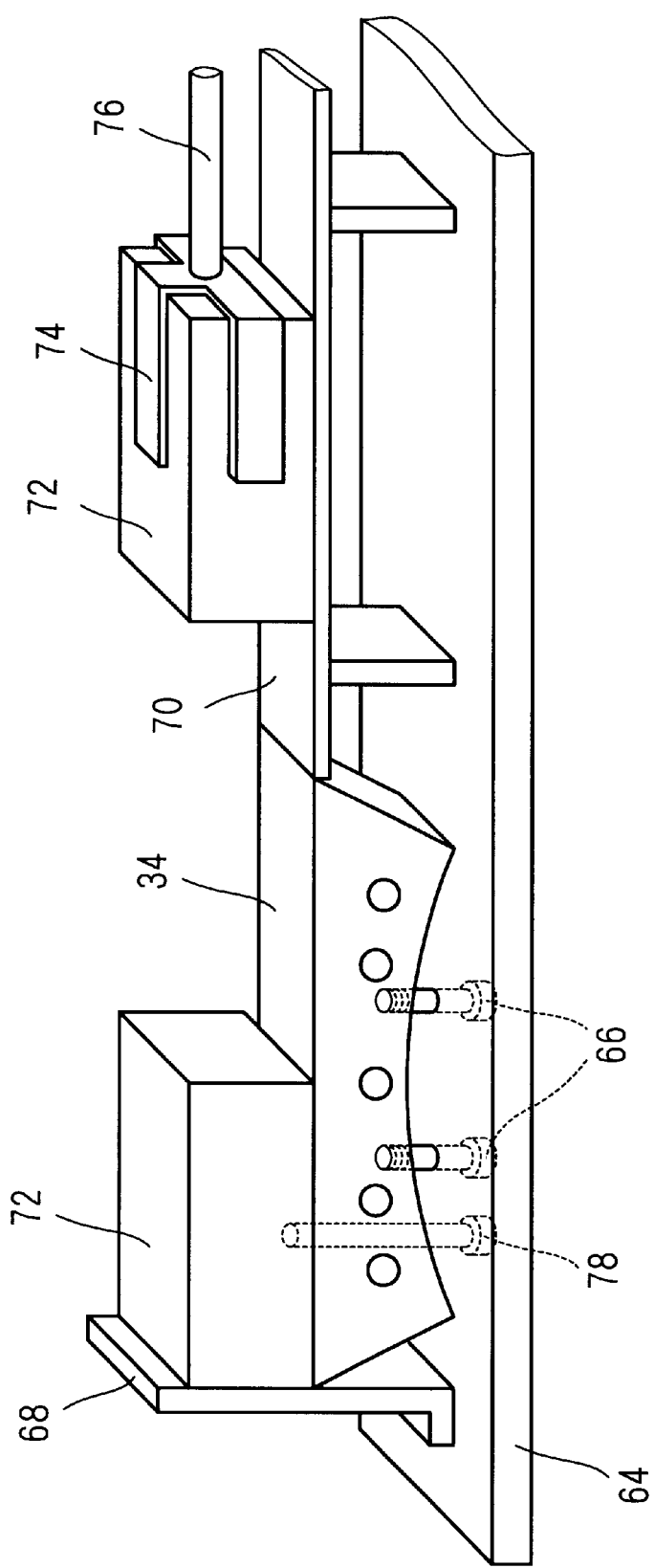
FIG. 6 is an illustration showing a step of installing the permanent magnet to the annular-projection piece.

The plate yokes 12a, 12b as described above are magnetically connected by two cylindrical column yokes 58. The column yokes 58 are respectively disposed between connecting portions 16a, 16b and between the connecting portions 18a, 18b, and fixed to the respective connecting portions 16a, 18a of the plate yoke 12a by fixing bolts 60. Further, the plate yoke 12b has a lower surface provided with three leg portions 62, respectively at a front portion and locations corresponding to the two column yokes 58. Next, steps of assembling the permanent magnet 40 and retainer plate 46 to the annular-projection piece 34 in the magnetic field generator 10 will be described with reference to FIG. 6.

First, the annular-projection piece 34 is placed, with the outside surface thereof facing upward, and fixed by fixing screws 66 on a working table 64. The working table 64 is provided with a positioning jig 68, which is a plate-like piece of nonmagnetic material standing to contact an end of the outside surface of the annular-projection piece 34, i.e. the surface to which the permanent magnet is fixed. The positioning jig 68 is fixed to the working table 64 by screws (not illustrated) for example. On the other hand, at the other end of the outside surface of the annular-projection piece 34, a sliding table 70 is placed so that the outside surface of the annular-projection piece 34 and an upper surface of the sliding table 70 become generally flush with each other, providing a continuous plane.

With the above preparation, a first magnet block 72 is disposed on the sliding table 70. The magnet block 72 is a component formed by stacking and bonding eight (=2×2 ×2) of the unit-piece magnet 42 shown in FIG. 4. The magnet block 72 is held firmly by a holding portion 74 and is pushed by an arm 76 out of the sliding table 70 onto the outside surface of the annular-projection piece 34, sliding on the annular-projection piece 34 to contact the positioning jig 68.

During the above operation, since the annular-projection piece 34 is made of soft iron, the magnet block 72 is strongly attracted to the annular-projection piece 34. While being attracted strongly, the first magnet block 72 is pushed up by a screw 78 threaded from beneath the working table 64, and an adhesive is applied between the magnet block 72 and the annular-projection piece 34. Thereafter, the screw 78 is unthreaded to allow the magnet block 72 to bond to the annular-projection piece 34. Then, likewise, a second magnet block 72 is held firmly by the holding portion 74 and is pushed by the arm 76 toward the outside surface of the annular-projection piece 34. The pushing operation is stopped just before reaching a predetermined fixing position, to allow application of the adhesive to the predetermined fixing position on the annular-projection piece 34, and to an end surface of the first magnet block 72. Thereafter, the second magnet block 72 is pushed by the arm 76 to the predetermined fixing position to complete the fixing. It should be noted here that there is a repelling force between the magnet block 72 which is already fixed and the magnet block 72 which is to be fixed. If the magnet block 72 to be fixed is repelled off the surface, an air cylinder (not illustrated) may be provided above the holding portion 74 to press the magnet block 72 downward. The magnet blocks 72, i.e. the permanent magnets 40 are thus fixed to the outside surface of the annular-projection piece 34. In the above operation, since the outside surface of the annular-projection piece 34 is a flat surface, the magnet block 72 can be slid linearly and easily on the outside surface. Therefore, the magnet block 72 can be easily transported and fixed to a desired position on the outside surface of the annular-projection piece 34.

Thereafter, the retainer plate 46 is disposed on an upper surface of the magnet block 72 and then fastened by the fixing screws 48.

Next, steps for assembling the pole piece 22b will be described with reference to FIG. 7A through FIG. 7C.

Figure 7A:
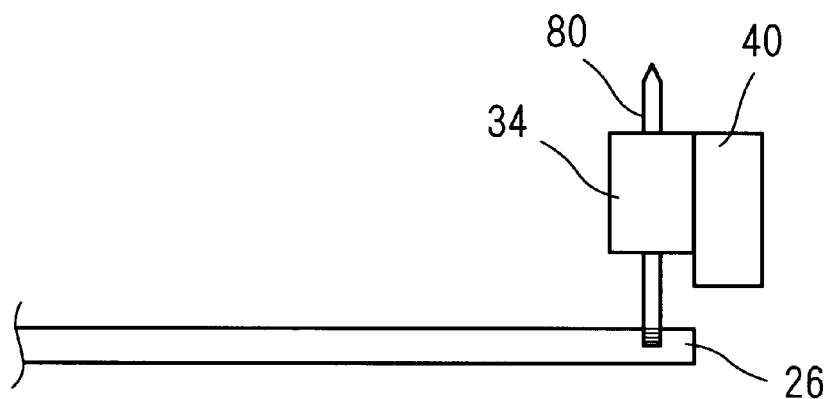
FIG. 7A is an illustration showing a step of installing an annular-projection piece on a base plate.

First, as shown in FIG. 7A, a guide stake 80 is threaded into the base plate 26 of the pole piece 22b. Next, the annular-projection piece 34, with the permanent magnet 40 installed thereto, is lowered on the guide stake 80, allowing the guide stake 80 into the guide hole 38 of the annular-projection piece 34, thereby placing the annular-projection piece 34 onto the guide plate 26. If the annular-projection piece 34 cannot be easily lowered due to repelling force from the annular-projection piece 34 which is already installed, then the guide stake 80 may be formed with a male thread in advance, and a mating nut (not illustrated) to be threaded by the guide stake 80 may be disposed on the annular-projection piece 34. With this arrangement, the annular-projection piece 34 can be lowered by tightening the nut. The lowered annular-projection piece 34 is fixed with the screws 36 onto the base plate 26. Thereafter, the guide stake 80 is removed.

Figure 7B:
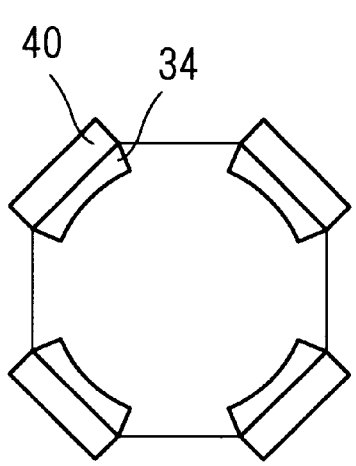
FIG. 7B and FIG. 7C are illustrations showing an order of installing the annular-projection pieces.
Figure 7C:
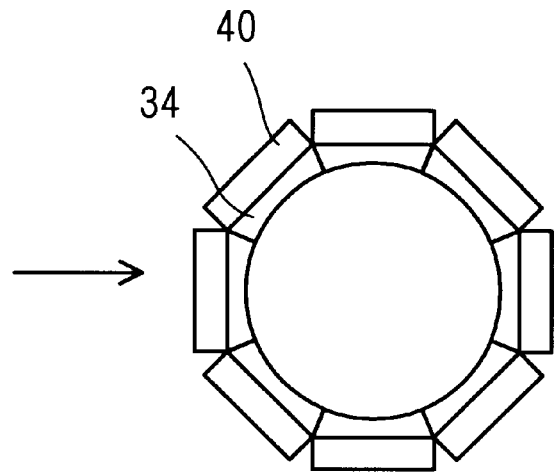

In the above described installation of the annular-projection piece 34, annular-projection pieces 34 are first installed at every other positions as shown in FIG. 7B, and then, as shown in FIG. 7C, the rest of the annular-projection pieces 34 are installed, to fill the positions between the annular-projection pieces 34 which are already installed. During the installation, the above described method of installation by tightening the nut is desirably used because the repelling force is very strong.

Figure 8:
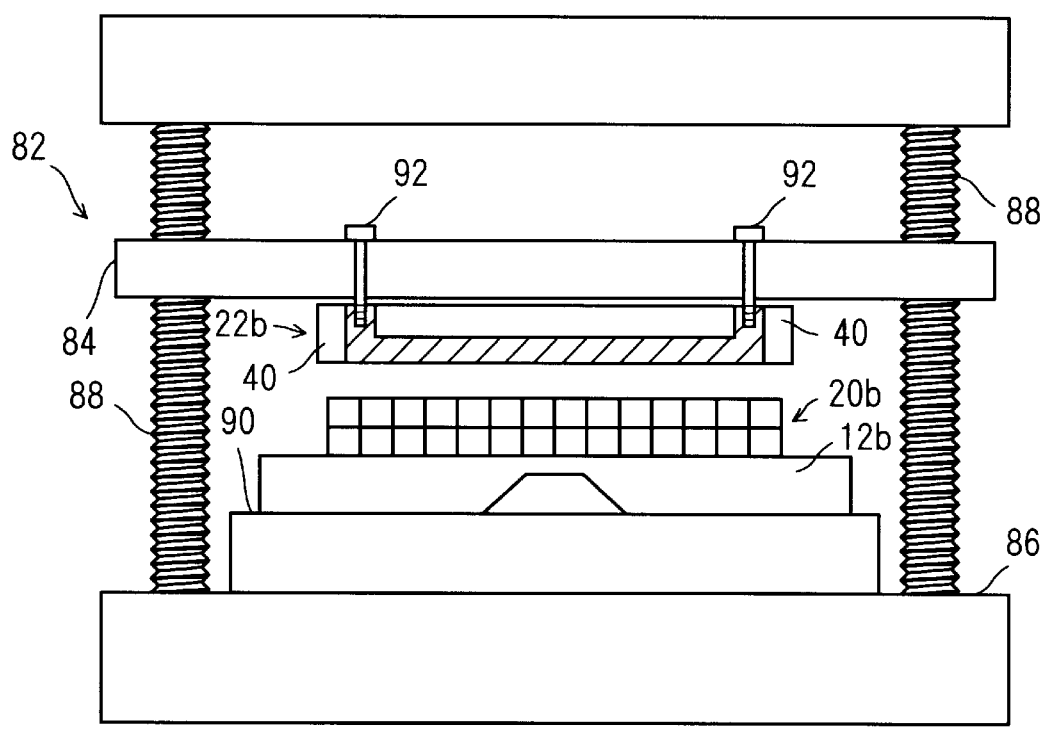
FIG. 8 is an illustration showing a method for installing the pole piece on a permanent magnet group.

The pole piece 22b assembled according to the above described method, is then fixed onto the permanent magnet group 20b by using a lift 82, for example, as shown in FIG. 8. The lift 82 includes a lifting table 84 made of a nonmagnetic material such as a stainless steel (SUS304). The lifting table 84 can be vertically moved by rotation of threaded driving shafts 88 built on a base table 86. The base table 86 has an upper surface provided with a turntable 90, on which the plate yoke 12b and the permanent magnet group 20b are disposed. The pole piece 22b is suspended by screws 92 which penetrate the lifting table 84. The screws 92 are threaded into respective guide holes 38 of the pole piece 22b. By lowering the lifting table 84, the pole piece 22b is disposed on the permanent magnet group 20b, and then fixed onto the permanent magnet group 20b by screws (not illustrated). The same arrangement applies to the pole piece 22a.

As has been described above, according to the magnetic field generator 10, the permanent magnet 40 is fixed in advance onto the outside surface of each annular-projection piece 34, and a predetermined number of the annular-projection pieces 34 each mounted with the permanent magnet 40 are installed onto the base plate 26. Therefore, there is no need for installing the permanent magnets 40 to the annular projection 32 which has been disposed on the base late 26. Specifically, the fixation of the permanent magnet 40 becomes easy by dividing the annular projection 32. As result, assembly of the pole-piece units 11a, 11b, and further of the magnetic field generator 10 become easy, leading to improved production efficiency even if there is a need for an intense magnetic field and therefore a R—Fe—B magnet is used as the unit-piece magnet.

Further, by inserting the guide stake 80 attached on the base plate 26 into the guide hole 38 of the annular-projection piece 34, the annular-projection piece 34 can be guided to a predetermined place on the base plate 26. Therefore, positioning of the annular-projection piece 34 becomes easy.

The magnetic field generator 10 as described above and a prior art magnetic field generator were compared in an experiment in which each was built to generate a magnetic field of 0.4 T in a space between their respective pole pieces. Results show that the prior art, which did not use the permanent magnets 40 for reduction of magnetic flux leakage, needed a greater amount of permanent magnet, i.e. 4.9 tons, due to greater magnetic flux leakage. On the other hand, the magnetic field generator 10, which could reduce the magnetic flux leakage by using the permanent magnets 40, needed 3.9 tons of permanent magnet. Therefore, according to the magnetic field generator 10, the amount of permanent magnet to be used can be reduced, and cost can be reduced. Next, referring to FIG. 9, a magnetic field generator 100 as another embodiment of the present invention, to be used for an MRI, comprises a pair of pole-piece units 102a, 102bfacing each other with a space in between. The pole-piece nit 102a, 102b respectively include plate yokes 104a, 104b.

The plate yokes 104a, 104b have respective surfaces facing each other and provided with permanent magnet groups 106a, 106b. The permanent magnet groups 106a, 106b have respective surfaces facing each other and provided with pole pieces 108a, 108b respectively fastened thereto.

Each of the permanent magnet groups 106a, 106b is made by stacking a plurality of unit-piece magnets 110 in three layers. Each of the unit-piece magnets 110 is made of a cubic R—Fe—B magnet having a side of 50 mm for example.

The pole piece 108a includes a base plate 112 made of disc-shaped iron for example, disposed on a main surface of the permanent magnet group 106a. The base plate 112 has a main surface provided with a silicon steel plate 114 for preventing generation of eddy current. The silicon steel plate 114 is fixed with an adhesive onto the base plate 112.

The base plate 112 has a circumferential portion formed with an annular projection 116, made of iron for example, for increasing magnetic field strength around the circumferential portion. The annular projection 116 is formed essentially in the same way as in the annular projection 32, and includes a plurality of annular-projection pieces 34 as shown in FIG. 3 for example.

Figure 9:
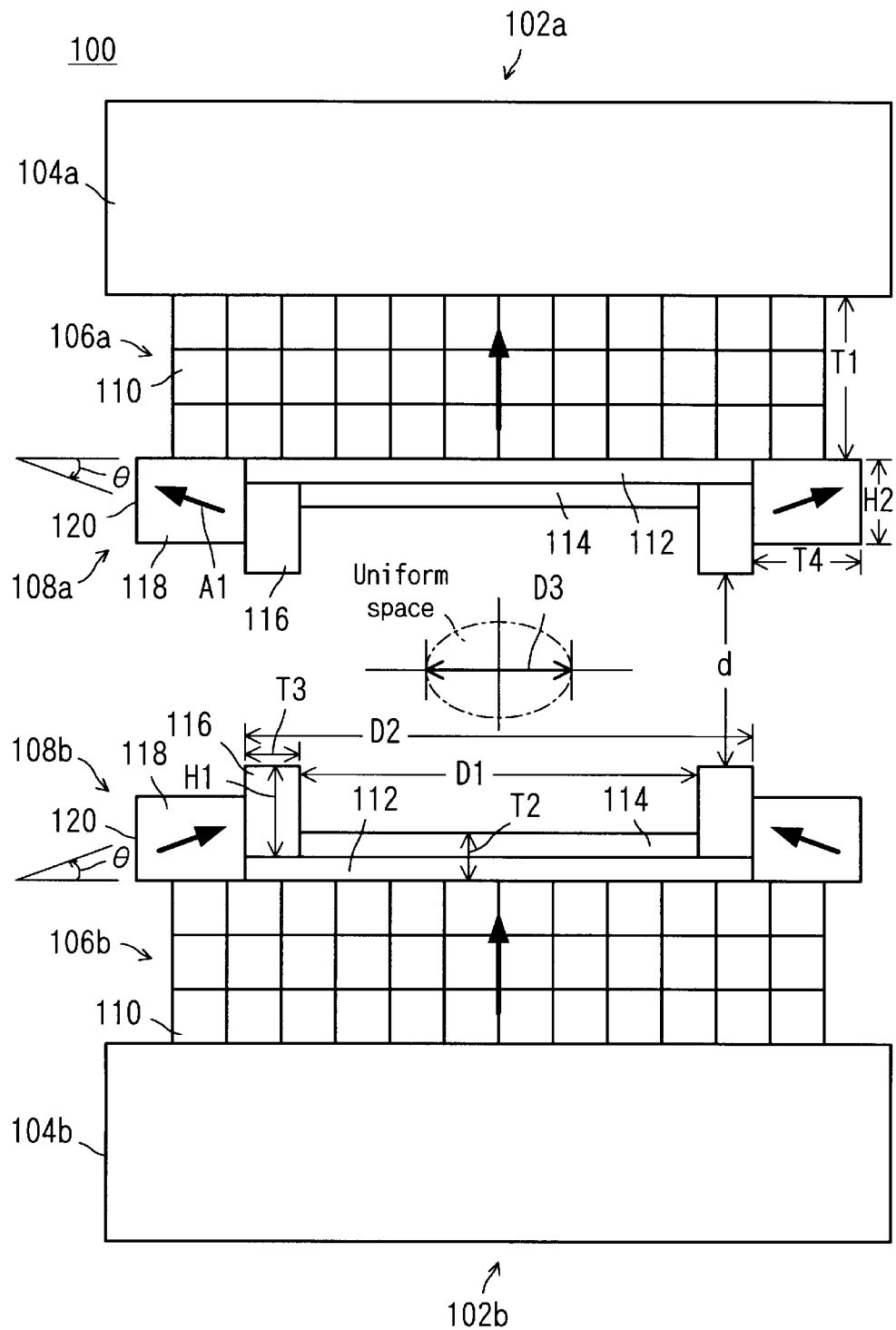
FIG. 9 is an illustration showing an outline of another embodiment of the present invention.

The outside surface of the annular projection 116, i.e. the outside surface of each annular-projection piece 34, is mounted with a permanent magnet 118 for reduction of magnetic flux leakage. The permanent magnet 118 induces magnetic flux to concentrate between the pole pieces 108a, 108b, and reduce the magnetic flux leakage. The permanent magnet 118 is formed into a generally rectangular parallelepiped block by stacking a plurality of generally rectangular parallelepiped unit-piece magnets each made of a R—Fe—B magnet for example. Here, attention should be made to a magnetizing direction Al of the permanent magnet 118. As shown in FIG. 9, the permanent magnet 118 is formed so that the magnetizing direction Al makes an acute angle with respect to the main surface 120 of the permanent magnet 118. Therefore, each of the unit-piece magnet constituting the permanent magnet 118 is formed likewise so that the magnetizing direction thereof makes an acute angle with respect to a main surface of the unit-piece magnet. By disposing the permanent magnet 118 so as to contact a main surface of the permanent magnet group 106a, an outside surface of the base plate 112 and the outside surface of the annular projection 116, the magnetizing direction Al of the permanent magnet 118 can be slanted with respect to the main surface of the permanent magnet group 106a. On an outside surface of the permanent magnet 118, the above described retainer plate 46 for example is disposed. In this case, the permanent magnet 118 and the retainer plate 46 are fixed to the annular-projection piece 34, i.e. to the annular projection 116, by using a fixing screw for example. The same applies to the pole piece 108b.

The plate yokes 104a, 104b are magnetically connected by two cylindrical column yokes 58, in the same manner as in the magnetic field generator 10 shown in FIG. 1. The plate yokes 104a, 104b and the column yokes 58 are mutually connected and fixed together by fixing bolts for example.

Figure 10:
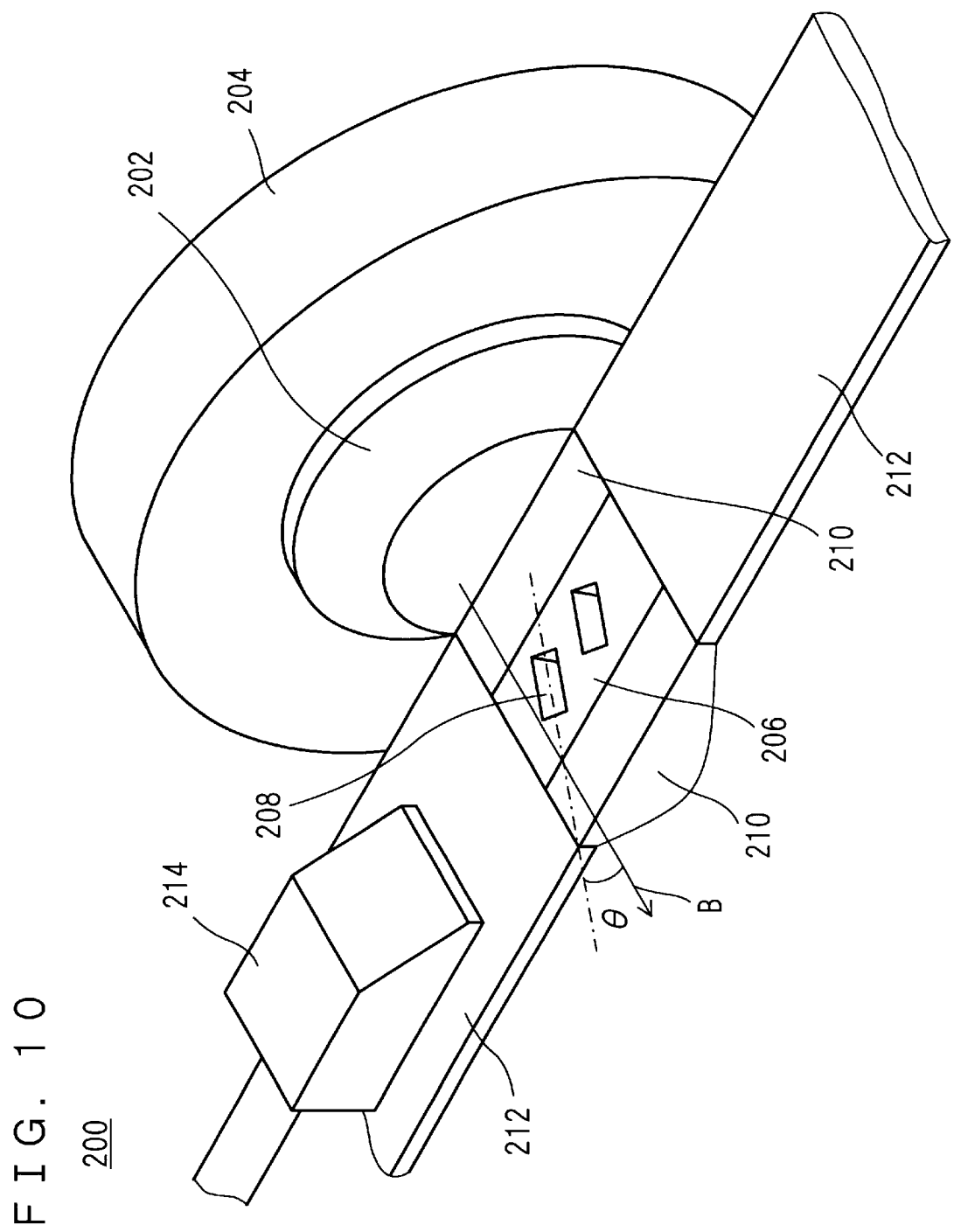
FIG. 10 is an illustration showing an example of a pressing apparatus.

The unit-piece magnets used in the permanent magnet 118 are manufactured by using a pressing apparatus 200 as shown in FIG. 10 for example.

The pressing apparatus 200 comprises a pair of opposed yokes 202 (Only one yoke is shown in FIG. 10.) The yokes 202 are surrounded by coils 204 respectively. By applying electric current to the coil 204, a magnetic field is generated.

A die 206 made of a nonmagnetic or weak-magnetic material is provided between the pair of yokes 202. The die 206 is formed with a plurality of vertical through holes 208. The through holes 208 each having a rectangular section are formed to slant at a magnetizing angle θ with respect to a magnetic orienting direction B provided by the yokes 202.

Between the pair of yokes 202, a die set 210 is provided, sandwiching the die 206. Further, a base plate 212 is disposed to sandwich the die 206 and the die set 210 perpendicularly with respect to the magnetic orienting direction B. The die 206, the die set 210 and the base plate 212 have respective upper surfaces flush among each other. Further, on the base plate 212, a powder feeding box 214 containing a powder is disposed movably toward and from the die 206.

By using the pressing apparatus 200 as described above, the powder is magnetically oriented in the through holes 208 and pressed by unillustrated pairs of prismatic upper and lower punches into compacts. The compacts are then sintered to become the unit-piece magnets each having a desired magnetizing angle θ. The method of making the magnet is disclosed in the U.S. Pat. No. 4,770,723.

Next, description will cover experiments conducted by using the magnetic field generator 100.

The experiments were made under the following conditions: a thickness T1 of the permanent magnet group 106a, 106b was 150 mm; a total thickness T2 of the base plate 112 and the silicon steel plate 114 was 65 mm; a height Hi of the annular projection 116 was 64 mm, a thickness T3 thereof was 65 mm; a height H2 of the permanent magnet 118 was 80 mm, a thickness T4 thereof was 120 mm; an inner diameter D1 of the annular projection 116 was 855 mm, an outer diameter D2 thereof was 983 mm; and a distance d between pole pieces 108a and 108b was 405 mm. With this arrangement, the uniform space having a shape of vertically flattened sphere is formed between the pole pieces 108a, 108b.

First, in the magnetic field generator 100, the magnetizing angle θ of the permanent magnet 118 was varied, and a horizontal diameter D3 of the uniform space and a center magnetic field strength thereof were measured.

Figure 11A:
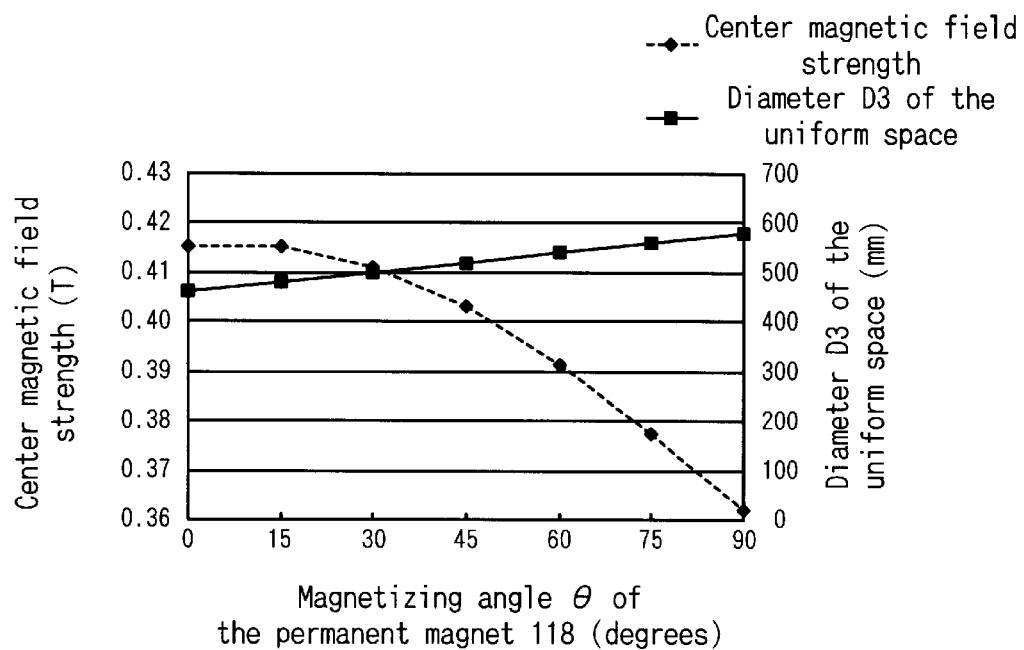
FIG. 11A is a graph showing relationships of a magnetizing angle with a center magnetic field strength and with a diameter of a uniform space.

From FIG. 11A, it is understood that the uniform space enlarges when the magnetizing angle θ of the permanent magnet 118 is increased. Thus, by disposing the permanent magnets 118 with the magnetizing angle θ slanted with respect to the main surfaces of the permanent magnet groups 106a, 106b, greater amount of magnetic flux can be introduced into an imaging space, and the uniform space can be increased. Therefore, the uniform space can be increased without increasing the amount of permanent magnet 118 to be used and without increasing cost. Further, by adjusting the magnetizing angle θ, a desired uniform space and center magnetic field strength can be obtained.

Next, in the magnetic field generator 100, the diameter of the pole pieces 108a, 108b and the thickness of the annular projection 116 were varied in accordance with the variation in the magnetizing angle θ of the permanent magnet 118 so as to keep constant the horizontal diameter D3 of the uniform space, and the center magnetic field strength was measured. In this experiment, the permanent magnet groups 106a, 106b were not varied.

As described above, the uniform space enlarges when the magnetizing angle θ is increased. Therefore, in order to make constant the diameter D3 of the uniform space, the size of the pole pieces 108a, 108b should be decreased in accordance with the increase in the magnetizing angle θ of the permanent magnet 118. By using this method, the magnetic field strength in the space can be increased. Thus, the permanent magnet 118 can be used at an increased efficiency, and in a case when generating a magnetic field of the same strength, the amount of magnet to be used can be decreased to the extent the magnetic field strength is increased. Therefore, it becomes possible to reduce cost and the weight of magnetic field generator 100.

Figure 11B:
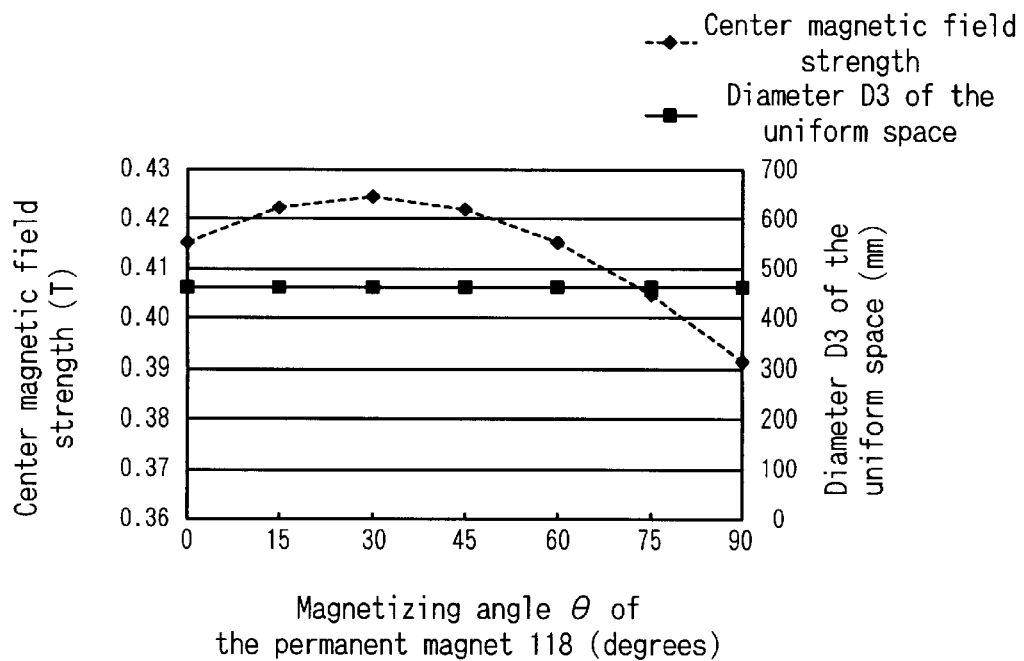
FIG. 11B is a graph showing a relationship between the magnetizing angle and the center magnetic field strength in a case where the diameter of the uniform space is kept constant.

From FIG. 11B, it is learned that if the magnetizing angle θ is within a range of 0 degree through 60 degrees, the center magnetic field strength can be made not smaller than when the magnetizing angle θ is 0 degree. Especially, if the magnetizing angle θ is between 10 degrees through 50 degrees, the center magnetic field strength can be not smaller than 0.42 T, becoming possible to obtain a stronger magnetic field. More preferably, the magnetizing angle θ is between 15 degrees through 45 degrees.

Further, from results of another experiment shown in FIG. 12, if the center magnetic field strength and the distance d between the pole pieces 108a, 108b are kept constant, with the magnetizing angle θ being set at 30 degrees, it becomes possible to reduce the total weight of the magnet to 2313 kg, which is lighter by 100 kg than when the magnetizing angle θ is 0 degree; and by 610 kg than when the permanent magnets 118 are not provided. In this experiment, the diameter D3 of the uniform space was 400 mm. Therefore, weights of the plate yokes 104a and 104b can be reduced.

The magnets used as the permanent magnets 118 have the magnetizing direction Al already slanted. Therefore, by only disposing the permanent magnets 118 directly on the main surfaces of the permanent magnet groups 106a, 106b, disposition of the permanent magnets 118 for reduction of magnetic flux leakage having a desired magnetizing angle θ can be carried out easily.

Figure 13:
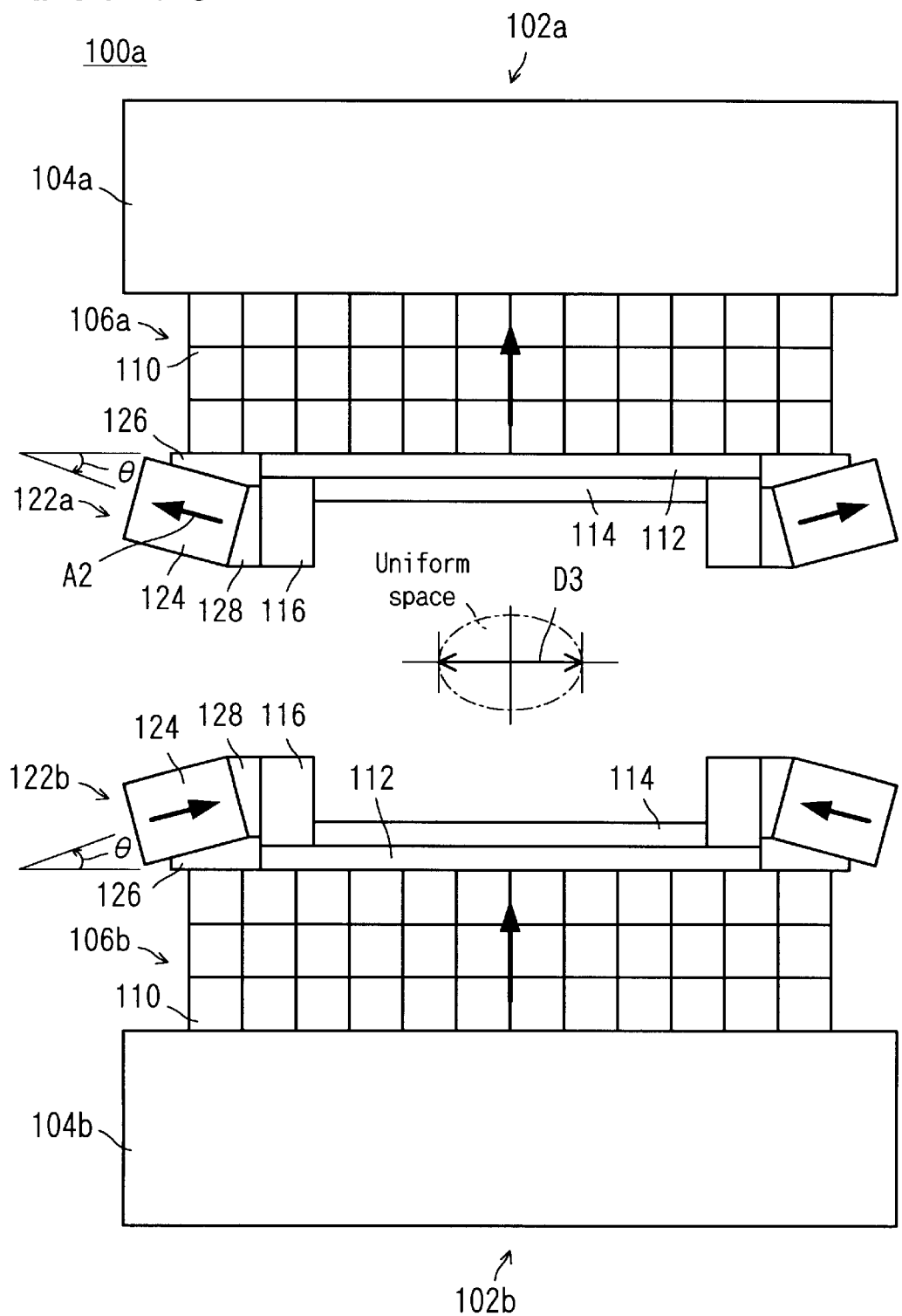
FIG. 13 is an illustration showing an outline of still another embodiment of the present invention.

Further, a magnetic field generator 100a as shown in FIG. 13 may be used.

According to the magnetic field generator 100a, a permanent magnet 124 is used as the permanent magnet for reduction of magnetic flux leakage included in the pole pieces 122a, 122b. The permanent magnet 124 has a magnetizing direction A2 in parallel or vertical to each surface of the permanent magnet 124. In this case, members 126 and 128 each having a trapezoidal section are used in order to dispose the permanent magnet 124 so that the magnetizing direction A2 of the permanent magnet 124 is slanted with respect to the corresponding main surface of the permanent magnet groups 106a, 106b. Other arrangements are essentially the same as in the magnetic field generator 100 shown in FIG. 9, and therefore will not be repeated here.

According to the magnetic field generator 100a, the permanent magnets 124 themselves are slanted at the desired angle with respect to the main surfaces of the respective permanent magnet groups 106a, 106b. Therefore, a permanent magnet magnetized in any direction can be used as the permanent magnet for reduction of magnetic flux leakage. Particularly, a commonly available permanent magnet magnetized in a direction in parallel or vertical to each surface thereof can be used, making possible to easily obtain the permanent magnets for reduction of magnetic flux leakage. Further, the same effect as in the magnetic field generator 100 can be obtained in the magnetic field generator 100a.

It should be noted here that alternatively, the outside surface of the annular projection 116 may be slanted, and the permanent magnets 118 and 124 for reduction of magnetic flux leakage may be installed to the slanted outside surface. In this case again, the same effect as in the magnetic field generator 100 can be obtained.

Further, the column yoke in the present invention includes a plate-like column yoke such as disclosed in the U.S. patent application Ser. No. 09/386,146.

The present invention can also be applied to a magnetic field generator comprising a single column yoke.

The present invention being thus far described and illustrated in detail, it is obvious that these description and drawings only represent an example of the present invention, and should not be interpreted as limiting the invention. The spirit and scope of the present invention is only limited by words used in the accompanied claims.

What is claimed is:

1. A magnetic field generator comprising a pair of pole-piece units and a column yoke magnetically connecting the pair of pole-piece units, wherein each of the pole-piece units includes a plate yoke, a permanent magnet group provided on a main surface of the plate yoke, and a pole piece provided on a main surface of the permanent magnet group, the pole piece including a base plate mounted on the permanent magnet group, an annular projection having a plurality of annular-projection pieces, and a permanent magnet for reduction of magnetic flux leakage provided on an outside surface of each of the annular-projection pieces, the permanent magnet being substantially in physical contact with the permanent magnet group, and the annular projection pieces being radially divided pieces.

2. A magnetic field generator comprising:

a plate yoke;

a permanent magnet group provided on a main surface of the plate yoke; and a pole piece provided on a main surface of the permanent magnet group, wherein the pole piece includes a base plate mounted on the permanent magnet group, an annular projection and a permanent magnet for reduction of magnetic flux leakage provided on an outside surface of the annular projection, the permanent magnet for reduction of magnetic flux leakage being disposed, with a magnetizing direction thereof being slanted with respect to the main surface of the permanent magnet group, the permanent magnet being substantially in physical contact with the permanent magnet group, and the annular projection pieces being radially divided pieces.

3. The generator according to claim 2, wherein the permanent magnet for reduction of magnetic flux leakage is generally rectangular parallelepiped, the magnetizing direction making an acute angle with respect to a main surface of the permanent magnet.

4. The generator according to claim 2, wherein the permanent magnet for reduction of magnetic flux leakage is generally rectangular parallelepiped, being slanted with respect to the main surface of the permanent magnet group.

5. The generator according to claim 2, wherein a dimension of the pole piece is determined in accordance with a magnetizing angle of the permanent magnet for reduction of magnetic flux leakage.

6. The generator according to claim 5, wherein the magnetizing angle of the permanent magnet for reduction of magnetic flux leakage is greater than 0 degree and smaller than 60 degrees.

* * * * *